United States Patent [19]

Norström et al.

[11] Patent Number: 4,740,484
[45] Date of Patent: Apr. 26, 1988

[54] METHOD IN THE MANUFACTURE OF INTEGRATED CIRCUITS

[75] Inventors: Hans Norström, Akersberga; Sture Petersson, Björklinge; Rudolf Buchta, Österskär, all of Sweden

[73] Assignee: Stiftelsen Institutet for Mikrovagsteknik VID Tekniska Hogskolan I Stockholm, Sweden

[21] Appl. No.: 933,522
[22] PCT Filed: Mar. 4, 1986
[86] PCT No.: PCT/SE86/00091
 § 371 Date: Oct. 30, 1986
 § 102(e) Date: Oct. 30, 1986
[87] PCT Pub. No.: WO86/05321
 PCT Pub. Date: Sep. 12, 1986

[30] Foreign Application Priority Data
Mar. 7, 1985 [SE] Sweden .................. 8501122

[51] Int. Cl.[4] .................. H01L 21/88; H01L 21/90; H01L 23/50
[52] U.S. Cl. .................. 437/200; 437/44; 437/202; 437/193; 357/71
[58] Field of Search .................. 29/571, 590; 357/71; 437/200, 201, 202

[56] References Cited

U.S. PATENT DOCUMENTS

| | | | |
|---|---|---|---|
| 4,254,428 | 3/1981 | Feth et al. | 29/590 |
| 4,356,622 | 11/1982 | Widmann | 29/571 |
| 4,374,700 | 2/1983 | Scott et al. | 29/571 |
| 4,476,482 | 10/1984 | Scott et al. | 357/71 |
| 4,622,735 | 11/1986 | Shibata | 29/571 |

OTHER PUBLICATIONS

Ting, "Silicide for Contacts and Interconnects", IEDM Technical Digest, 1984, pp. 110–113.
Alperin et al, "Development of the Self-Aligned Titanium Silicide Process for VLSI Applications", IEEE Journal of Solid-State Circuits, vol. SC-20, No. 1, Feb. 1985, pp. 61–67.
Jones et al, "Salicide with Buried Silicide Layer", IBM Technical Disclosure Bulletin, vol. 27, No. 2, Jul. 1984, pp. 1044–1045.
Adler et al, "Process for Fabricating Field-Effect Transistors with Polysilicon Gates Containing Metal Silicide", IBM Technical Disclosure Bulletin, vol. 26, No. 5, Oct. 1983, pp. 2309–2310.
Murarka, *Silicides for VLSI Applications*, Academic Press, Inc., 1983.

*Primary Examiner*—Brian E. Hearn
*Assistant Examiner*—Mary A. Wilczewski
*Attorney, Agent, or Firm*—Silverman, Cass, Singer & Winburn, Ltd.

[57] ABSTRACT

A method for manufacturing integrated circuits in which conductors and gate structures are built-up on a substrate plate, the conductors incorporating a layer of polycrystalline silicon and the gate structures including a gate electrode of polycrystalline silicon, where each of the gate structures is surrounded by doped source-and-drain-areas and where the gate electrode and the source-and-drain-areas respectively are metallized by depositing thereon a metal which reacts with the silicon from which the gate electrode and the source-and-drain-areas are comprised, so as to form a silicide layer. In accordance with the invention the gate electrode (3) is metallized in a first process stage. The source-and-drain-areas (18, 19) are metallized in a later process stage. Subsequent to metallizing the gate electrode in the first process stage, a protective layer (5) is applied to the metallized layer (4) of the gate electrode in a second process stage. All layers (16, 13, 7) present on the source-and-drain-areas (18, 19) are then removed to expose silicon, whereafter a metal (8) capable of reacting with the exposed silicon is deposited over the substrate, therewith to metallize (9, 10) the source-and-drain-areas (18, 19). In the second process stage, the protective layer (5) is given a thickness such that subsequent to the aforementioned etching process there remains a given, smallest thickness sufficient to ensure that the deposited metal (8) will not react with the silicon of the gate electrode (3, 4).

8 Claims, 2 Drawing Sheets

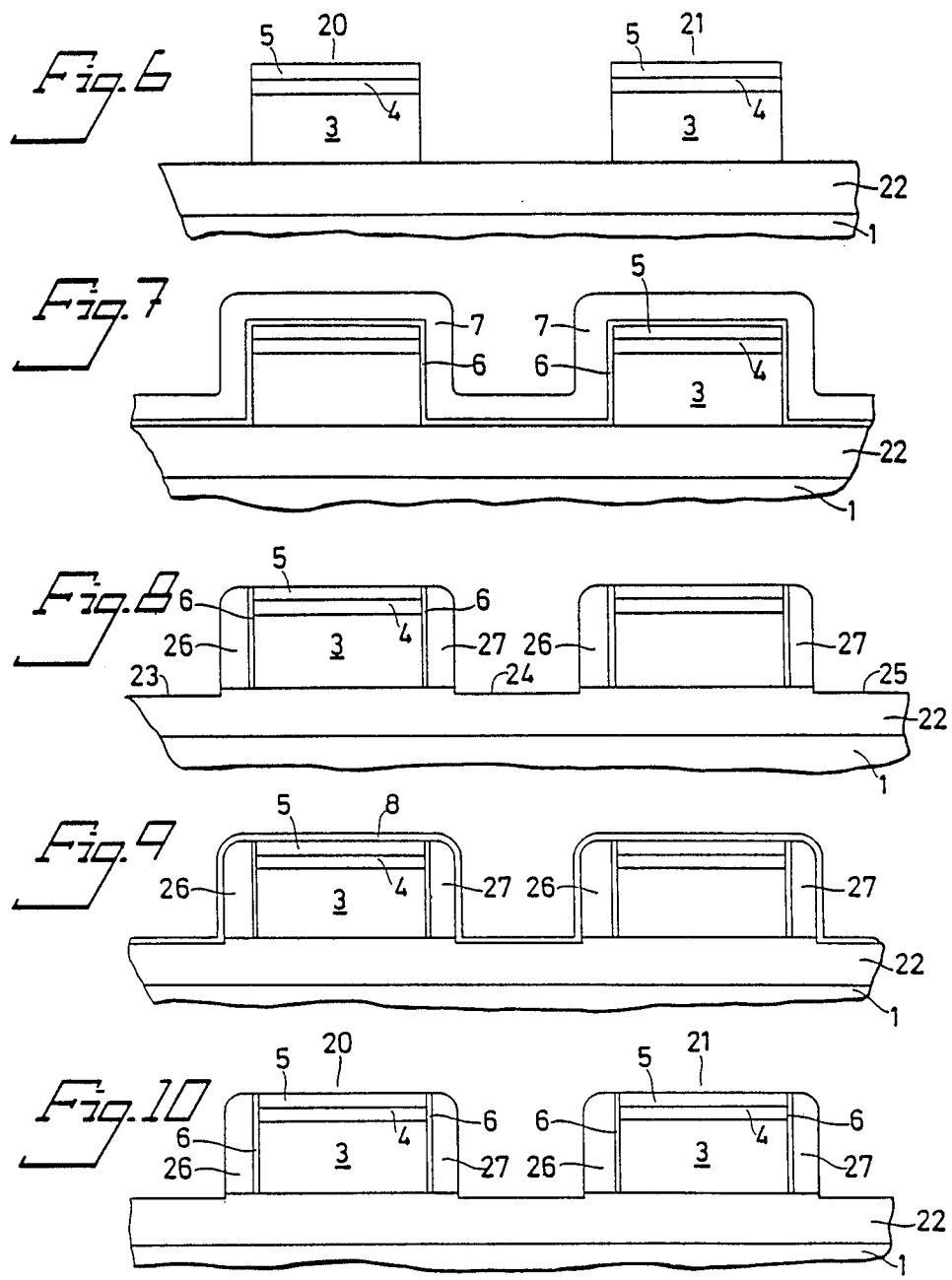

METHOD IN THE MANUFACTURE OF INTEGRATED CIRCUITS

The present invention relates to a method in the manufacture of integrated circuits.

When miniaturizing the dimensions of integrated circuits, such as so-called NMOS-circuits and CMOS-circuits, it has been found that gate-conductors and connecting conductors made of polycrystalline silicon in accordance with predominantly prevailing methods constitute a limiting factor with regard to the performance of the circuits. This is because these conductors have an excessively high resistance, which results in RC-type time constants of such magnitudes as to restrict the speed of the circuits.

In order to reduce the resistance in the conductors, the polycrystalline silicon gate-conductors have been provided with a metallic, conductive top layer. This reduces the resistance of the conductors by a factor of 10 to 20.

The metal layers deposited on the conductors must be stable at temperatures of up to about 900° C., since the metal layer is deposited prior to activation of ion implantations. This restricts the choice of the silicide used to one which is stable at high temperatures, such as $WSi_2$, $TaSi_2$, $MoSi_2$, and $TiSi_2$ or refractory metals, such as tungsten (W).

In the case of circuit elements of micrometer-size, or of smaller size, it has been found that the doped conductive surfaces located adjacent the gate-structure, i.e. the so-called source-and-drain-areas, must also be metallized, in order to improve their surface conductivity.

This is effected by siliciding, i.e. depositing a metal which reacts with silicon present in the doped areas, to form therewith a metallic conductive silicide.

Consequently, in the case of integrated circuit elements of the aforesaid dimensions, it is necessary to metallize both the gate electrodes, conductors and the source-and-drain-areas.

In accordance with one known method, platinum is deposited onto the circuit, when provided with gate structures and conductors and when parts of the circuit which are not to be metallized comprise silicon oxide. The circuit structure is then heated, so that the platinum reacts with the silicon present, to form a silicide. Non-reacted metal is then removed from the silicon-oxide surfaces with the aid of a selective etching process, i.e. a process which does not affect metallized silicon. The advantage afforded by this technique is that precise measurements can be achieved with regard to the extensions of the metallized surfaces, without needing to machine the elements concerned.

In order to avoid the occurrence of short-circuits between the source-and-drain-areas and the gate electrode, there has been developed a technology in which an insulating layer is built-up between the source-and-drain-areas and the gate electrode. In this case, the gate electrode and source-and-drain-areas are metallized subsequent to forming the insulating layer. A suitable metal is deposited over the circuit, whereafter the circuit is heat-treated to cause the metal to react with the polycrystalline silicon of the gate electrode and with the monocrystalline silicon of the source/drain areas. Metal located outside the metallized areas is then etched away, with the aid of a selective etching process, while leaving the insulating layers intact. This method is called the SALICIDE-process.

All of the aforedescribed methods have a common drawback, namely that the same silicide must be used on both the gate and the source/drain areas. It follows from this that mutually different silicides cannot be chosen for the various areas to be treated. It is highly desirable to be able to choose different silicides for the gate electrodes and the source/drain areas.

A further disadvantage with the SALICIDE-process is that despite the presence of the insulating layers it is difficult to eliminate the occurrence of short-circuiting between the gate electrodes and the source/drain areas, due to the necessity of using high-temperature silicides.

The insulating layers comprise, for example, silicon nitride. At the high temperatures applied in the metallizing process, silicon migrates from the polycrystalline silicon of the gate electrode and from the monocrystalline silicon of the source/drain areas to the metal deposited on the respective surfaces thereof, to form streaks or patches of silicide on the outer surface of the insulating layer. These silicide streaks or patches are not removed during the subsequent selective etching process, and hence result in short-circuiting. Short-circuiting between two mutually parallel polycrystalline silicon conductors can also be caused in this way. Consequently, it is necessary to space two parallel conductors relatively far apart.

Even though the silicide patches or streaks do not become fully developed, it is still possible that sufficient silicon has migrated from the source/drain areas on both sides of a gate structure to destroy the doped volumes present at these locations.

These drawbacks, together with others, are eliminated by means of the present invention. Thus, the invention enables one silicide to be optimized separately for the gate electrode and one for the source/drain areas. Short-circuiting due to the presence of silicide patches or streaks on the outer surface of the insulation layers is also avoided.

The present invention relates to a method in the manufacture of integrated circuits in which conductors or interconnects and so-called gate structures are built-up on a substrate plate, the interconnects incorporating a layer of polycrystalline silicon and the gate structures incorporating a gate electrode of polycrystalline silicon, where each of the gate structures is surrounded by doped so-called source-and-drain-areas, and where the gate electrode and the source-and-drain-areas are metallized by depositing thereon a metal which reacts with the silicon constituting the gate electrode and source-and-drain-areas, so as to form a silicide layer on the gate electrode and on the source-and-drain-areas. The method is characterized by metallizing the gate electrode in a first process stage and metallizing the source-and-drain-areas in a later process stage; by applying a protective layer to the metallized layer of the gate electrode in a second process stage, subsequent to metallizing the gate electrode in the first process stage; by removing all layers present on the source-and-drain-areas with the aid of a suitable etching technique, so as to expose the silicon at these areas; by depositing over the substrate a metal which is reacted with the exposed silicon so as to metallize the source and drain areas; by giving the protective layer applied in said second process stage a thickness of such magnitude that after said etching process there will remain a given smallest thickness sufficient to prevent the deposited metal from reacting with the silicon in the gate electrode; and by giving the protective layer in said second process stage a chemical composition such that said layer will not react with the deposited material.

The invention will now be described in more detail with reference to an exemplifying embodiment thereof illustrated in the accompanying drawings, in which

BRIEF DESCRIPTION OF THE DRAWINGS

FIGS. 6–10 illustrate various stages in the manufacture of parallel conductors in accordance with the invention.

DETAILED DESCRIPTION OF THE INVENTION

Figure 1:
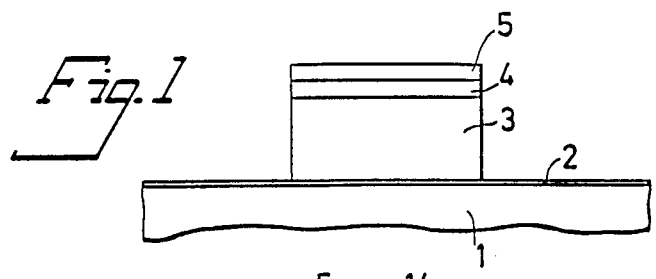
FIGS. 1–5 illustrate various stages in the manufacture of a gate structure in accordance with the invention.

Referring to FIG. 1, a control oxide 2, suitably silicon dioxide ($SiO_2$) is applied to a monocrystalline silicon plate 1, a so-called substrate plate. The control oxide 2 is preferably cultivated thermally, although it can be substituted with a much thinner layer of nitrated control oxide. The control oxide layer 2 has a thickness of about 150 Å to 300 Å. A layer 3 of polycrystalline silicon is deposited on the control oxide layer 2 to a thickness of about 0.2 to 0.5 μm. This layer is then doped to provide p-type or n-type conduction. A silicide layer 4 is then deposited, in a first process stage, over the polycrystalline silicon layer 3, by means of the so-called LPCVD-method (Low Pressure Chemical Vapour Deposition), or with the aid of so-called Co-Vapourization or so-called Co-sputtering techniques. The silicide layer 4 may have a thickness of about 0.1 to 0.2 μm.

This silicide can be homogenized at elevated temperature, or may be used directly in the continued process.

In accordance with the invention, a protective layer 5 in the form of an oxide, such as $SiO_2$, or nitride, such as $Si_3N_4$, is then deposited in a second process stage onto the silicide layer 4, i.e. the metallized gate electrode. The source-and-drain-areas are metallized in a later process stage, described in detail hereinafter. Prior to this later stage, all layers located on the source-and-drain-areas are removed with the aid of some suitable etching process, so as to expose the silicon present. A metal is then deposited over the substrate and caused to react with the exposed silicon, so as to metallize the source-and-drain-areas.

The aforesaid protective layer 5 is intended to protect the silicide layer 4 on the gate electrode during the process of metallizing the source-and-drain-areas. Consequently, the protective layer 5 deposited in the second process stage is given, to this end, a thickness of such magnitude that upon completing of the aforesaid etching process there remains a given smallest thickness sufficient to prevent the metal deposited from reacting with the silicon in the gate electrode. In addition, the protective layer 5 deposited in the second process stage is given a chemical composition such as to exclude the possibility of chemical reaction with the deposited metal. As will be evident from the following, the protective layer 5 ultimately constitutes an etching mask.

Subsequent to dry-etching of the structure illustrated in FIG. 1, a light n-type implantation is effected in the ultimate source/drain areas, preferably a silicon dioxide layer ($SiO_2$) 6 having a thickness of about 500 Å. This layer is applied in a manner such that the structure obtains a good bond for a layer of silicon nitride applied in the next process stage.

In accordance with the invention there is now applied, i.e. after the second process stage but prior to the later process stage, conformly over the gate structures and the source-and-drain-areas an insulating layer 7, the composition of this insulating layer being such as not to react with the metal with which the source-and-drain-areas are metallized. In accordance with one embodiment, the insulating layer 7 comprises silicon dioxide ($SiO_2$). In accordance with a further embodiment, however, the insulating layer comprises silicon nitride ($Si_3N_4$), which may be preferred in view of the fact that silicon dioxide can be etched with relative ease.

Figure 2:
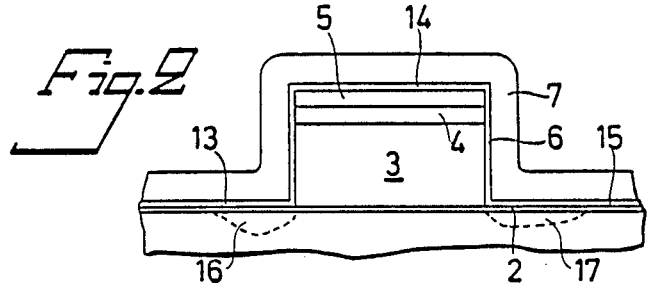

Thus, in the illustrated embodiment, there is deposited onto the silicon dioxide layer 6 a layer of silicon nitride having a thickness of about 1500 Å. The structure thus formed is illustrated in FIG. 2. Prior to depositing the nitride layer 7, but subsequent to depositing the silicon dioxide layer 6, a so-called "pull-back" oxidation process can be effected, so as to make the silicon dioxide layer 6 denser and/or slightly increase its thickness.

Figure 3:
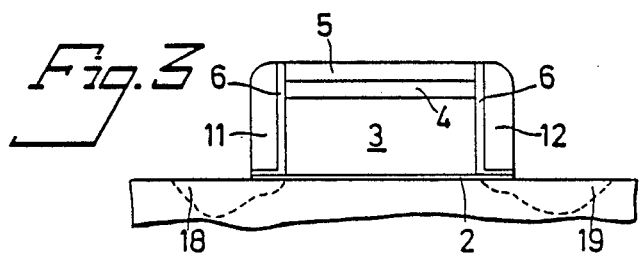
Figure 4:
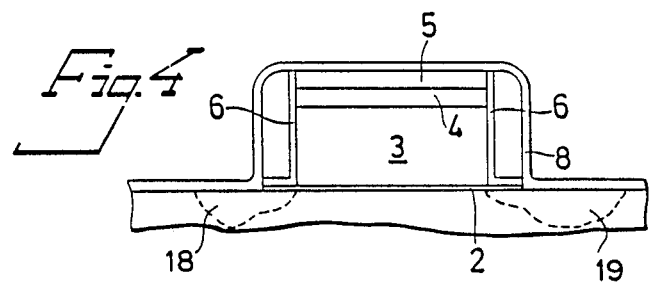

The resultant structure, illustrated in FIG. 2, is then dry etched in the absence of an etching mask, wherewith horizontal layers in FIG. 2 are successively etched away until the horizontal layers of silicon nitride 7 have been removed, so as to form insulating layers 11,12 on the vertical side of the first layers 3,4,5 applied to the gate structure, of FIG. 3. The insulating layers 11,12 thus comprise parts of the nitride layer which are not etched away along the vertical edges of the gate structure. The etching procedure is effected with the aid of a direction-dependent dry etching method, such as reactive sputtering for example. This method is chosen so as to be selective, provided that it does not result in etching of the oxides. The silicon dioxide layer 6 and the protective layer 5 are therefore left unaffected.

The horizontal parts 13,14,15 of the silicon dioxide layer 6 are then etched away with the aid of said dry etching technique, which is selected in this regard so as not to etch away mono-silicon.

In this respect, according to one embodiment, the parts 16,17 of the control oxide layer 2 located externally of the gate structure are also etched away.

The method employing reactive sputtering can be chosen or adapted, in a known manner, so as to be selectively reactive with different compounds, by varying the composition of the ionized gas used in the etching process.

Alternatively, the selectivity of the sputtering method can be selected so that both the horizontal layers of silicon nitride and the horizontal parts of the silicon dioxide layer, together with said parts of the control oxide layer, are etched away in one and the same etching procedure.

At this stage the source/drain areas 18,19 may be implanted more heavily.

Subsequent to activating these areas, a mild wet-etching method may be applied in order to remove residual control oxide 2 from the source/drain areas, when this part of the control oxide layer has not been etched away in a previous etching process. As before mentioned, the protective layer 5 shall have a thickness such that a given smallest thickness remains subsequent to etching away the thinner control oxide layer 2. Consequently, the silicide layer 4 is still protected by the protective layer 5, even after etching away said parts 16,17 of the control oxide layer 2, and even though the protective layer is, of course, slightly thinner than it was originally.

Alternatively, as before mentioned, the control oxide 2 can be removed with the aid of a dry etching technique. Any radiation damage occurring herewith in the source/drain areas can be repaired in the subsequent formation of silicide in a later process stage, as described hereinafter.

The whole of the structure obtained, and illustrated in FIG. 3, has deposited thereon a metal or a metal layer 8. The metal chosen in this respect is one which will produce a desired silicide upon reaction between the metal in question and the exposed, pure silicon in the metal-coated source/drain areas. In a subsequent heat-treatment process, the aforesaid metal 8 reacts with the monocrystalline silicon layer 1, to form a silicide layer 9,10 at the source/drain areas.

As before mentioned, the properties of the protective layer 5 are such as to render the layer non-reactive with the applied metal 8. Both silicon dioxide and silicon nitride exhibit these properties, and hence both of these preferred compounds are suitable for use in forming a protective layer 5. Because the protective layer 5 does not react with the metal layer 8, no silicide is formed, and hence no conductive streaks or patches are formed on the protective layer 5. Neither will the insulating layers 11,12 react with the metal layer 8. Thus, the aforesaid short-circuiting is totally avoided when applying the present invention.

As before mentioned, the protective layer 5 also prevents the silicide layer 4 from reacting with the metal layer. The absence of the protective layer, however, would cause the deposited metal 8 to react with silicon in the polycrystalline layer 3, therewith to form further silicide.

Figure 5:
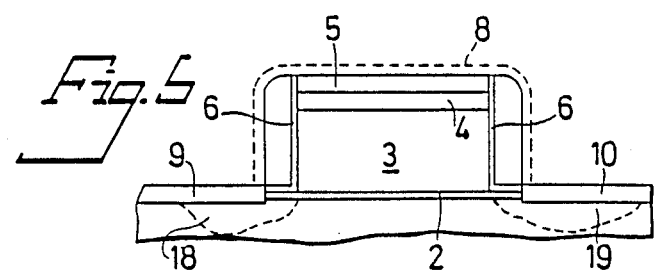

Subsequent to heat-treating the structure, non-reacted metal is etched away, as illustrated in broken lines in FIG. 5, with the aid of a suitable selective wet-chemical etching method which leaves the silicized source/drain areas 9,10 unaffected.

The final structure is obtained herewith. As an alternative to applying a metal layer 8, selective tungsten may be precipitated on the exposed silicon surfaces in the source/drain areas, as illustrated in FIG. 3, therewith to obtain the final structure directly.

In this case, a gaseous tungsten hexafluoride ($WF_6$) is precipitated under low pressure with the aid of the aforesaid LPCVD-method, the gas reacting with silicon to form silicon tetrafluoride ($SiF_4$) which departs in gas form, wherewith tungsten is deposited on the silicon surfaces in accordance with the formula

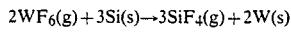
$$2WF_6(g) + 3Si(s) \rightarrow 3SiF_4(g) + 2W(s)$$

Besides the fact that silicon nitride does not react with the applied metal layer 8, reaction of a protective layer 5 of silicon nitride with applied metal and the underlying polycrystalline silicon layer 3 is also prevented, as before mentioned, and hence the protective layer 5 in accordance with a further embodiment comprises silicon nitride.

The essential feature, however, is not the compound with which the protective layer is formed, even though silicon dioxide is preferred, but that there is applied a protective layer 5 which will prevent the silicide layer 4 being influenced during the process of manufacture of a complete structure, and particularly during the process of silicidizing the source/drain areas.

Thus, the present invention enables mutually different silicides to be chosen for gate electrodes 4 and the source/drain areas 9,10 which in turn enable an optimal silicide to be chosen for the gate electrode 4 and the source/drain areas 9,10. An advantage is afforded when the silicide used for the gate electrodes is one which is stable at high temperatures and which is a silicon-rich silicide of low resistivity. For example, the silicides $WSi_2$, $TaSi_2$, $MoSi_2$ and $TiSi_2$ are suitable silicides for the gate electrode.

In the case of the source/drain areas, it is desirable to use a silicide having a high metal/silicon ratio, as a result of the shallow implantations occurring in these areas, i.e. shallow p- and n-transitions. Examples of suitable silicides in this respect are $Pd_2Si$ and $PtSi$. These silicides are not stable at high temperatures. The use of such silicides is enabled by means of the present invention, however, since it is not necessary to apply high temperatures subsequent to silicidizing the gate electrode.

Because mutually different silicides can be used, it is also possible to obtain a lower resistance in the gate electrode than in the source/drain areas. The aforesaid conventional methods, such as the so-called SALICIDE-method, however, utilize the same silicide and the same thickness of silicide layer both for the gate-electrode and the source/drain areas.

Furthermore, as before mentioned, the invention enables tungsten to be deposited selectively on the source/drain areas with the aid of LPCVD-deposition techniques. When the invention is not applied, there is a serious risk of being unable to precipitate selective tungsten both on doped polycrystalline silicon and monocrystalline silicon without precipitating tungsten onto the oxide layer at the same time.

The drawbacks and disadvantages mentioned in the introduction are thus circumvented when applying the present invention. It will also be seen that the present invention constitutes a large step forward in the art, since different silicides and different methods of forming said silicides can be used.

In accordance with one preferred embodiment of the present invention, the aforesaid conductors are treated in the same manner as the gate electrodes and simultaneously therewith. In this respect, the conductors are also provided with a protective layer subsequent to having been metallized. The conductors are then treated in the same manner as the gate structures in the continued construction of the circuit.

FIGS. 6–10 illustrate procedures effected simultaneously with conductors 20,21 on the same substrate as the gate structures. Starting from a mono-silicon plate 1, a layer 22 of silicon dioxide has been built-up at the location where the interconnects 20, 21 are formed.

In FIGS. 6–10 the same references have been used for the same layers as those illustrated in FIGS. 1–5, since conductors illustrated in FIGS. 6–10 are built-up at the same time as the gate structures illustrated in FIGS. 1–5.

Subsequent to building-up the layer 22 and applying the control oxide layer 2,C in accordance with FIG. 1, interconnects and gate-structures are built-up simultaneously. Thus, there is formed a layer 3 of polycrystalline silicon, a silicide layer 4, a protective layer 5, a silicon dioxide layer 6, and a silicon nitride layer 7. This results in the structure illustrated in FIG. 7. The horizontal parts of the silicon-nitride layer 7 and the silicon dioxide layer 6 are etched away, so as to provide the structure illustrated in FIG. 8. The recesses 23,24,25 located on both side of the interconnects 20,21 appear when the control oxide layer 2 is etched away on both sides of the gate structure. Thus, insulating layers 26,27 are formed on the vertical sides of respective interconnects 20,21 in the manner aforedescribed. The metal layer 8 is then applied. The layer 5 and the layer 22, however, comprise silicon dioxide which is non-reactive with the metal applied.

Because of this, the whole of the applied metal layer 8 is etched away in conjunction with etching away the metal which has not reacted with silicon at the gate structures, and hence the resultant structure illustrated in FIG. 10 is identical with the structure illustrated in FIG. 8. Thus, no silicidization occurs around the interconnects. The risk of short-circuiting of the aforesaid nature is thus eliminated. The silicide 4 chosen for the interconnects may also be independent of the silicide used for the source/drain areas.

It will be understood that the invention is not restricted to the aforedescribed embodiment. For example, the illustrated structures and interconnects may be formed in a manner different to that described, and the recited measurements and compounds can be varied without departing from the concept of the invention, namely the use of a protective layer.

The present invention is therefore solely restricted by the scope of the following claims.

We claim:

1. A method of manufacturing integrated circuits in which interconnects and gate structures are built upon a substrate plate, said interconnects incorporating a layer of polycrystalline silicon, said gate structures incorporating a gate electrode of polycrystalline silicon, said layers of polycrystalline silicon insulated from said substrate plate by a field oxide layer or a control oxide layer, where each of said gate structures is surrounded by doped source and drain areas and where said gate electrode and said source and drain areas are metallized by depositing thereon a metal which reacts with the silicon from which said gate electrode and source and drain areas are fabricated so as to form a silicide layer on said gate electrode and source and drain areas respectively, comprising:

(a) metallizing said gate electrode with a first metallic layer;
   (b) applying a protective layer having a thickness onto said first metallic layer of said gate electrode;
   (c) applying an insulating layer over said gate structures, said source and drain areas and said interconnects;
   (d) removing all layers located on said source and drain areas and on areas beside said interconnects with a conventional suitable, direction-dependent dry etching method to etch away the insulating layer parallel with said substrate plate, such that the insulating layer is retained on vertical sides of said gate structure and on vertical sides of said interconnects in order to prevent short-circuiting between said gate electrode and associated source and drain areas or between two mutually adjacent interconnects such that silicon is exposed at said source and drain areas;
   (e) metallizing said source and drain areas separately from said gate electrode by depositing a second metallic layer over said substrate plate to react with said exposed silicon of said source and drain areas, said second metallic layer differing in composition from said first metallic layer;

wherein said thickness of said protective layer is sufficient to ensure that said metal for metallizing said source and drain areas will not react with said silicon of said gate electrode, and said layer is of a composition which will not react with said metal.

2. The method according to claim 1, characterized in that said interconnects are also provided with said protective layer simultaneously with said gate structures, subsequent to metallizing the silicon of said interconnects.

3. The method according to claim 1 characterized in that said protective layer comprises a layer of silicon dioxide ($SiO_2$).

4. The method according to claim 1, characterized in that the protective layer comprises a layer of silicon nitride ($SiO_3N_4$).

5. The method according to claim 1, characterized in that said insulating layer comprises silicon nitride ($SiO_3N_4$).

6. The method according to claim 1, characterized in that said insulating layer comprises silicon dioxide ($SiO_2$).

7. The method according to claim 5 characterized by applying a silicon dioxide layer over the gate-structure, the source-and-drain-areas, and the interconnects subsequent to said second process in order to increase the adhesion of a silicon-nitride insulating-layer to the gate-structures and the conductors.

8. The method according to claim 1, characterized in that the second metal is deposited to metallize the source-and-drain-areas by applying tungsten hexafluoride ($WF_6$) in gas phase and under low pressure, tungsten (W) being precipitated onto the source-and-drain-areas.

* * * * *